United States Patent [19]

Syverson

[11] Patent Number: 4,857,142
[45] Date of Patent: Aug. 15, 1989

[54] METHOD AND APPARATUS FOR CONTROLLING SIMULTANEOUS ETCHING OF FRONT AND BACK SIDES OF WAFERS

[75] Inventor: Daniel J. Syverson, Robbinsdale, Minn.

[73] Assignee: FSI International, Inc., Chaska, Minn.

[21] Appl. No.: 247,712

[22] Filed: Sep. 22, 1988

[51] Int. Cl.$^4$ .................. B44C 1/22; C03C 15/00; C03C 25/06
[52] U.S. Cl. .................. 156/646; 156/639; 156/653; 156/657; 156/345
[58] Field of Search ............... 156/639, 646, 653, 657, 156/662, 345; 252/79.1, 79.3; 134/3, 33, 157, 31

[56] References Cited

U.S. PATENT DOCUMENTS

| 4,339,297 | 7/1982 | Aigo | 156/639 X |
| 4,544,446 | 10/1985 | Cady | 156/639 |
| 4,749,440 | 6/1988 | Blackwood et al. | 156/646 |

*Primary Examiner*—William A. Powell
*Attorney, Agent, or Firm*—Palmatier & Sjoquist

[57] ABSTRACT

An enclosed chamber is provided to confine wafers to be processed with an etchent gas, and requiring moisture at the surface of the wafer in order to initiate the etching. Gases flowed over the face of the wafer and may be flowed across the backside of the wafer to controllably produce or restrict the etching, according to the nature of the gas supplied and flowed across the wafer.

18 Claims, 1 Drawing Sheet

METHOD AND APPARATUS FOR CONTROLLING SIMULTANEOUS ETCHING OF FRONT AND BACK SIDES OF WAFERS

This invention relates to the processing of wafers by treating the oxides on the surfaces thereof, and more particularly to the treating of such oxides and controlling the etching thereof in the processing of the wafers into integrated circuit chips.

BACKGROUND OF THE INVENTION

Until recently, the etching of wafers of silicon and the like for the purpose of producing integrated circuit chips has largely been accomplished through the use of plasma. As described in U.S. Pat. No. 4,749,440, etching of such wafers may also be effected through the use of anhydrous hydrogen fluoride and similar halogen gases, diluted with inert gas such as nitrogen, and small amounts of water vapor serving to initiate the etching process. In some instances of etching oxides with hygroscopic characteristics, the existence of inherent moisture in the oxide layer may eliminate the need for adding water vapor.

In the process of obtaining such etching through the use of hydrogen fluoride gas, a suitable degree of control has been obtained in etching away portions of the oxides at the front side of the wafer, in the field and cut pattern being produced on the face of the wafer. However, one side effect of the etching of the wafer has been an uncontrolled amount of etching at the backside of the wafer, particularly in the vicinity of the peripheral edge of the wafer.

In this regard, it has been experienced that maximum etching at the backside of the wafer occurs immediately adjacent the peripheral edge of the wafer, and the degree of etching at the backside of the wafer reduces at progressively increasing distances from their peripheral edge.

SUMMARY OF THE INVENTION

It is an object of the present invention to control etching of the oxide on the front and the back sides of a wafer so that during an etching process, etching only occurs at the portions of the wafer which are intentionally etched and to prevent or minimize unintentionally etching of other portions.

A feature of the invention is the treating of one side of a wafer with an inert gas such as nitrogen to prevent or minimize any likelihood of etching said one side, and simultaneously supplying an etchant gas such as hydrogen fluoride to the other side of the wafer to produce etching thereof.

Another feature of the invention is flowing such inert gas in low volume across one side of the wafer while the etchant gas is flowed across the other side of the wafer to produce etching at the other side of the wafer. In another form flowing such nitrogen gas in large volume for its drying effect across one side of the wafer prevents or minimizes any etching of said one side, while etching of the other side of the wafer proceeds. When large volumes of nitrogen are flowed for its drying effect across one side of the wafer, the nitrogen may carry the etchant which may stagnantly collect adjacent the other side of the wafer to produce an etching effect.

Still another feature of the invention is the provision of a wafer confining enclosure with a peripheral sidewall adjacent to the periphery of the wafer being treated, the enclosure defining chambers adjacent the front and back sides of the wafer and means supplying treating gases to both spaces simultaneously to treat and mask opposite sides of the wafer. Simultaneous application of nitrogen into one of the chambers masks the adjacent side of the wafer against etching, while the other side of the wafer may have etchant gas applied to it to produce the desired etch. The interior of the enclosure is electrically neutral to have no effect upon the gases supplied into the chambers.

DETAILED SPECIFICATION

Figure 1:
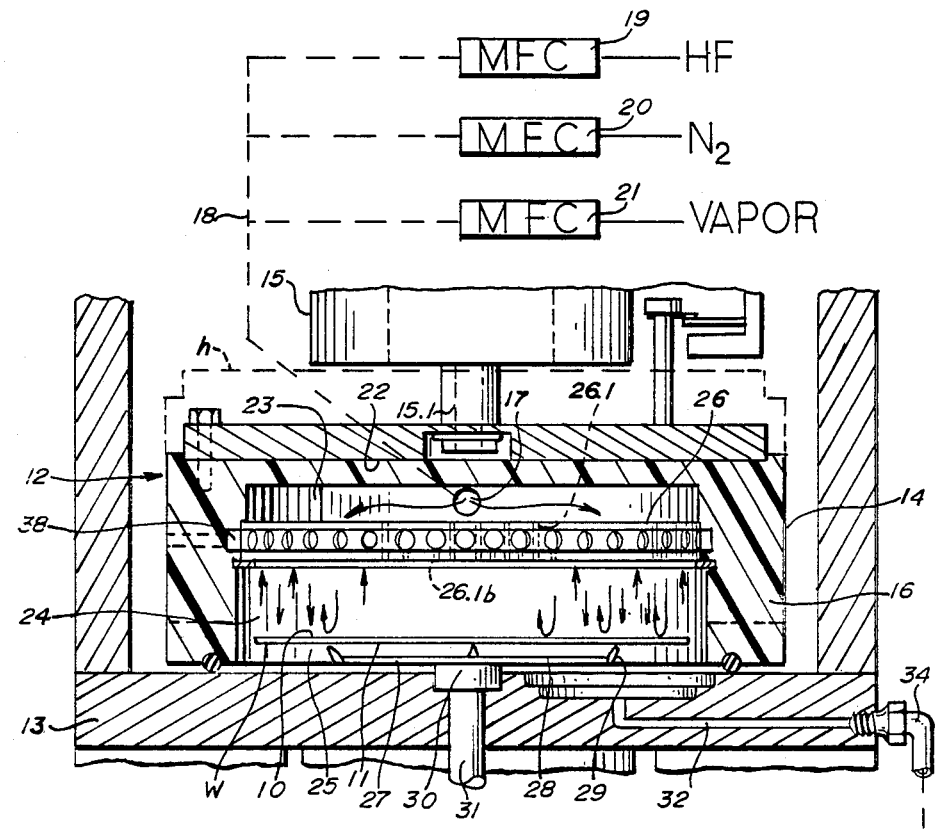
FIG. 1 is a longitudinal section view through the processing unit.
Figure 3:
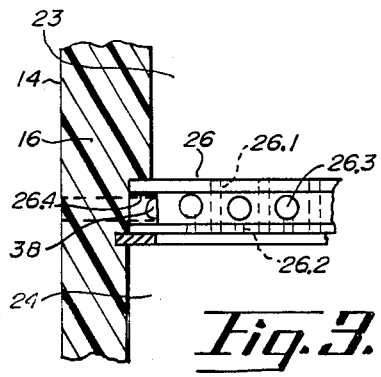
FIG. 3 is another form of construction of the processing unit which is illustrated in vertical section.

The present invention relates to the processing of silicon wafers, one of which is seen in FIG. 1 and is indicated in general by the letter W. It is well known by persons of skill that such wafers have oxide coatings and/or layers on both faces of the wafer. In most cases, only the front side 10 of the wafer has the field and cut pattern developed on it, and the back side 11 is covered with an oxide, the characteristics of which may vary from one wafer to another and may be created in various ways.

There may be almost twenty different oxides that may be encountered on the front and back sides of wafers in using the method and apparatus described herein. Such oxides may vary from native oxides to thermal oxides (TOX), and include various others such as a chemical vapor deposit oxide (CVDOX). It is known that thermal oxides are some of the most difficult to work with and to etch, and considerable experience has been developed in etching thermal oxides by using the methods and apparatus described herein.

One of the important characteristics of oxides are their relative etch rates. Thermal oxides have a relatively small etch rate. In contrast, the etch rates of the chemical vapor deposit oxides are considerably greater and will exceed the etch rate of thermal oxide by a ratio of approixmately three to one (3:1).

Oxide layers on silicon wafers also vary widely in thickness and may be as thin as 500 Angstroms more or less, or may be as thick as 5,000 Angstroms more or less.

It has been found that many of the oxide layers encountered in using the present invention contain a small amount of inherent moisture within the oxide layer. In many instances the amount of water moisture in the oxide layer is adequate to trigger or start the etching processing when the oxide layer is exposed to hydrogen fluoride gas and more specifically to the anhydrous fluoride gas. In some instances, as will be more particularly described herein, an inert gas such as nitrogen is specifically used in substantial quantities as to dry the oxide layer and remove the inherent moisture therein to prevent etching of that particular oxide layer. In some other instances as will be further described, moisture is added, substantially in the manner described in connection with prior U.S. Pat. No. 4,749,440 where the purpose of inducing etching in conjunction with the anhydrous hydrogen fluoride gas.

In respect to the removal or partial removal of oxide layers through the use of anhydrous hydrogen fluoride gas, water vapor, and diluted with inert nitrogen gas, the disclosure of said U.S. Pat. No. 4,749,440 is incorporated by reference.

Figure 2:
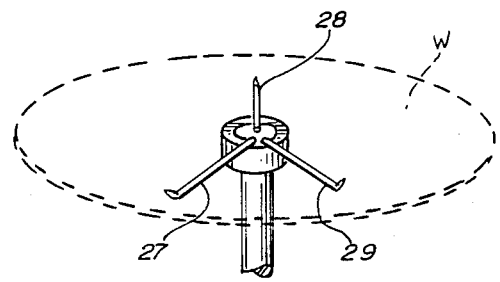
FIG. 2 is a perspective view of the wafer support of the processing unit.

In the form of apparatus illustrated in FIG. 1, one form of apparatus 12 suitable for carrying out the present invention is illustrated in FIGS. 1 and 2. The apparatus includes a stationary base plate 13 and a housing 14 with an open bottom which rests upon the base plate 13 and is adapted to be lifted off the base plate by a lifting device 15 which may be a piston rod of a pneumatic cylinder with its piston rod 15.1 capable of lifting the housing 14 to the dotted line position h in order to facilitate the wafer W from the interior of the housing and replacing the wafer with another one of the same nature.

The wafers W are circular in shape and accordingly, the side wall 16 of the housing 14 is cylindrical in shape. The side wall 16 has a gas inlet port 17 therethrough to which is connected a gas delivery duct or tube 18. The tube 18 is connected to sources of anhydrous hydrogen fluoride, inert gas such as nitrogen, and water vapor. For these purposes, mass flow controllers 19, 20 and 21 are connected to the flow duct 18 and serve as sources of those various gases respectively.

It will be recognized that although hydrogen fluoride has been found preferable in etching oxides for many purposes, the use of other halogen-containing gas has been suitable for some purposes. Such other anhydrous halogen gases may include chlorine, bromine, fluorine and iodine, and hydrohalogen gases including hydrogen iodine, hydrogen bromide and hydrogen chloride.

Because nitrogen is relatively cheap and highly available, it is a preferred gas to use, however other inert gases such as argon, neon, helium, krypton and xenon will serve the same purpose as the inert nitrogen gas. All of these gases are inert nd dry.

The interior of the housing 14 cooperates with the base 13 in defining an enclosure 22 which is separated or divided into a number of chambers 23, 24 and 25. The chamber 23 which communicates directly with the gas inlet port 17 serves as a plenum chamber for distributing the incoming gas across a diffuser plate 26 which separates the chamber 23 from the chamber 24. The chamber 24 may be considered to be the front chamber, confronting the front side 10 of the wafer W. The chamber 25, between the base 13 and the wafer W confronts the back side 11 of the wafer and may be considered the back chamber.

The diffuser plate 26 is provided with small holes 26.1 uniformly distributed across the plate, through which gas is supplied from the chamber 23 and into the chamber 24. The slight pressure on the gases in chamber 23 propels the gases onto the front face 10 of the spinning wafer for traversing the face. Spent gases are delivered from the chamber 24 through ports 26.2 which communicate with passages 26.3 of plate 26, as to carry the gases to the periphery of plate 26 and then into the annular manifold groove 26.4 and exit through the discharge port 38 through wall 16. A supply port 32 is provided in the base 13 for supplying gases into the back chamber 25.

Wafer 10 is supported between the front chamber 24 and the back chamber 25 on a skeletal frame or spider 27 having three arms 28 with upturned, pointed and sharpened ends 29 for engaging and supporting the back side of the wafer. The skeletal form 27 is affixed to and supported on a hub 30 which is carried by and rotated by a mounting shaft 31. The shaft 31 is connected with a motor so as to revolve the shaft, hub 30, and the wafer mounting frame 27. The wafer may be rotated during processing at a rate of 20 RPM or faster in order to insure a uniform application of the gases to the front side thereof.

The front chamber 24 is supplied with gas only through the diffuser plate 26.

The back side chamber 25 may also be supplied with treating gases, and for this purpose, a gas supply port 32 is formed in the base 13, and the open upper end is enlarged as at 33 for broader distribution of the gases supplied from the port 32. Gases supplied from the port 32 will spread themselves throughout the chamber 25 and be applied to the back side 11 of the wafer for treating the wafer.

The gas supply port 32 is connected to a gas supply duct or tube 34 connected to the base 13, and also connected to supplies of anhydrous hydrogen fluoride, inert gas such as nitrogen, and may also be connected to a source of water vapor as desired. These sources of treating gases are represented by the mass flow controllers 35, 36 and 37 which are considered as controllable sources of hydrogen fluoride, nitrogen, and water vapor respectively.

During etching of the oxide at the front side 10 of the wafer, various proportions and flow rates of hydrogen fluoride, nitrogen, and water vapor may be used, substantially as described in said U.S. Pat. No. 4,749,440. Typically the proportion of gases supplied to the front chamber 24 and to the front side of the wafer will amount to approximately 6 liters of nitrogen per minute, 2 liters of water vapor per minute, and 0.5 liters of anhydrous hydrogen fluoride per minute, for a total of 8.5 liters per minute of treating gas, or approximately 8,500 cc of processing gas per minute. Simultaneously with the supplying of treating gases at the front chamber 24, a small flow of inert gas such as nitrogen is supplied into the back chamber 25, and the flow of nitrogen through the port 32 and into chamber 25 may amount to about 20 cc per minute of the nitrogen gas. This flow of the inert gas through the back chamber 25 will traverse the entire back side of the wafer and eventually exit the back chamber adjacent the peripheral edge of the wafer W. The result of the flow of nitrogen through the back chamber 25 and across the back side 11 of the wafer is to prevent any etching of the back side of the wafer by the hydrogen fluoride which is supplied through the diffuser plate 26.

In another mode of operation, it may be desirable to remove a portion of or the entirety of the oxide on the back side 11 of the wafer, and to leave the front side 10 untouched by etchant gases. In this mode of operation, nitrogen alone is supplied through the chamber 23, through the diffuser plate 26 and into the front chamber 24 so as to provide a continuous flow of inert gas across the patterned oxide on the front side 10 of the wafer. The purpose of the nitrogen gas flowing across the front side of the wafer is to mask the front of the wafer.

In order to strip the oxide off the back side 11 of the wafer, hydrogen fluoride gas only is supplied in small quantities through the inlet port 32 and into the back side chamber 25 for etching or treating the back side 11 of the wafer. For this purpose, hydrogen fluoride gas is supplied at a rate of approximately 20 to 150 cc per minute. In many cases, the oxide on the back side of the wafer contains sufficient inherent moisture as to react with the anhydrous hydrogen fluoride gas supplied and as to etch the oxide from the backside of the wafer and strip the oxide entirely from the back side of the wafer. It may be desirable under certain circumstances to supply a small amount of water vapor, i.e. 600 cc, along with the hydrogen fluoride gas into the back chamber 25 in order to induce the etching process.

In still another mode of operation, when it is desired to simply strip a portion of or the entirety of the oxide off the back side 11 of the wafer, anhydrous hydrogen fluoride and nitrogen gas are flowed into the front chamber 24 as previously described with the nitrogen being supplied at a high rate of approximately 6,000 cc per minute, and the hydrogen fluoride may be supplied at the rate of approximately 100 cc per minute, and without any water vapor being supplied into the chamber 24. In this mode of operation, there is no gas supplied through the port 32 and into the back chamber 25. The large volume of nitrogen gas being supplied through chamber 24 and traversing the front side of the wafer has a significant drying effect and the nitrogen gas dries substantially all of the moisture from the oxide film on the front side of the wafer as to prevent the hydrogen fluoride gas from commencing any etch whatever at the front side of the wafer. The large amount of nitrogen gas and the small amount of hydrogen fluoride gas are, for the most part, discharged immediately through the discharge manifold 40 and outlet port 38. Because there is no flow through the back chamber 25, a quantity of the hydrogen fluoride gas and the nitrogen gas will stagnate or collect in the chamber 25; and this small amount of hydrogen fluoride gas will react with the water vapor inherent in the oxide on the back side 11 of the wafer as to produce an etching of the oxide and stripping of the oxide from the wafer. In this instance, this stripping of the oxide without flow of gases through the back side chamber 25 is relatively slow but can be used in certain processes.

It will be understood that when the etching of the wafer W is completed, the housing 14 may be lifted to the dotted line position h, thereby permitting the wafer to be removed and another one inserted.

It will be seen that the present invention provides a method of masking one side of the wafer while etching of the other side of the wafer is carried out and for simultaneously supplying inert gas as the hydrogen fluoride gas produces etching of the opposite side of the wafer.

Where in the claims hereof the term "etchant gas" is used, it is understood that this term may include only the reactive etching gas such as hydrogen fluoride, but the term also includes water vapor where it is necessary to use extra moisture in order to commence the etching process, however the term etchant gas is expressly intended to be limited only to the hydrogen fluoride or the other halogen containing gas when inherent moisture in the oxide is sufficient to initiate etching without the supplying of additional moisture from other sources.

What is claimed is:

1. A method of controlling etching of the oxides on the front and back sides of a spinning wafer, comprising treating portions of one side of the wafer with a flow of inert gas as to minimize likelihood of any etching of the oxide on said one side, and simultaneously treating portions of the other side of the wafer with an etchant gas to etch away portions of the oxide on said other side.

2. A method of controlling etching according to claim 1 wherein the flow of inert gas traverses portions of the back side of the wafer while the etchant gas etches portions of the oxide on the front side of the wafer.

3. A method of controlling etching according to claim 1 wherein the flow of inert gas traverses portions of a field and cut pattern at the front side of the wafer while the etchant gas etches portions of the oxide at the back side of the wafer.

4. A method of controlling etching according to claim 1 wherein the inert gas comprises at least one gas selected from a group of gases including nitrogen, argon, neon, helium, krypton and xenon.

5. A method of controlling etching according to claim 1 wherein the inert gas includes at least nitrogen.

6. A method of controlling etching according to claim 1 wherein the etchant gas includes hydrogen fluoride gas.

7. A method of controlling etching according to claim 1 wherein the etchant gas includes anhydrous hydrogen fluoride and water vapor.

8. A method of controlling etching according to claim 1 wherein at least a portion of the oxide contains inherent water moisture, the flow of inert gas has such a rate of flow as to produce a drying effect upon portions of the oxide at said one side of the wafer, and wherein said etchant gas has anhydrous characteristics.

9. A method of controlling etching according to claim 8 wherein the flow of inert gas traverses at least portions of the front side of the wafer, and the inert gas carries etchant gas therewith, and enclosing the back side of the wafer adjacent the periphery of the spinning wafer to define a chamber confining a portion of the nitrogen and etchant gases which remain nearly dormant and obtain etching of at least portions of the oxides on the back side of the wafer.

10. A method of controlling etching of the oxides on the front and back sides of a spinning wafer, comprising
confining the wafer between front and back chambers defined by an enclosure adjacent the periphery of the wafer and wherein the front and back sides of the wafer respectively confront the front and back chambers,
flowing etchant gas through the front chamber and across at least a portion of the front side of the wafer to etch portions of the oxide on the front side of the wafer,
and simultaneously masking the back side of the wafer by flowing inert gas through the back chamber as to minimize likelihood of any etching of the oxide on the back side of the wafer.

11. A method of controlling etching according to claim 10 and exhausting the inert gas through the annular space adjoining the periphery of the wafer.

12. A method of controlling etching of the oxides on the front and back sides of a spinning wafer, comprising
confining the wafer between front and back chambers defined by an enclosure adjacent the periphery of the wafer and wherein the front and back sides of the wafer respectively confront the front and back chambers,
flowing inert gas through the front chamber and across at least a portion of the front side of the wafer to mask said portion as to minimize likelihood of etching such a portion of the front side of the wafer, and simultaneously flowing etchant gas through the back chamber and across at least a portion of the back side of the wafer to etch the oxide on said portion of the back side of the wafer.

13. A method of controlling etching according to claim 12 and exhausting the gas from the back chamber through the annular space adjoining the periphery of the wafer.

14. A method of controlling etching according to claim 12 wherein the oxide on said portion of the back side of the wafer contains inherent moisture and the etchant gas comprises anhydrous hydrogen fluoride.

15. A method of controlling etching of the oxides containing inherent moisture on the front and back sides of a spinning wafer, comprising confining the wafer between front and back chambers defined by an enclosure closely adjacent the periphery of the wafer and wherein the front and back sides of the wafer respectively confront the front and back chambers, flowing nitrogen gas and anhydrous etchant gas through the front chamber and across the wafer, the nitrogen gas flowing at such a rate as to have a drying effect upon at least a portion of the oxide on the front side of the wafer to minimize the likelihood of etching of such oxide, a portion of the etchant gas and nitrogen gas collecting in the back chamber and remaining substantially dormant while the etchant gas etches at least a portion of the oxide on the back side of the wafer.

16. Apparatus for simultaneously treating both front and back sides of a wafer being processed by etching, comprising an openable housing defining an enclosure to confine such a wafer, wafer supporting means in the enclosure and supporting the wafer to traverse the enclosure and define front and back chambers adjoining the front and back sides of the wafer, the enclosure having a peripheral wall adjacent to the periphery of the wafer, the wafer supporting means including a skeletal frame engaging and supporting portions of the back side of the wafer for spinning while exposing other portions of the back side of the wafer to the back chamber, and valved gas supply and exhaust means communicating with the front chamber for flowing treating gases through the chamber and across the wafer, the gases also having access to the back chamber and to the portions of the back side of the wafer.

17. An apparatus according to claim 16 and a second valved gas supply means communicating with the back chamber for flowing treating gases through the chamber and across the wafer.

18. An apparatus according to claim 16 wherein the skeletal frame has sharpened wafer engaging points for supporting the wafer while minimizing the areas of the wafer which is masked from the gases in the back chamber.

* * * * *